(12) United States Patent
Jung et al.

(10) Patent No.: US 12,310,222 B2
(45) Date of Patent: May 20, 2025

(54) METHOD OF PRINTING MULTI-NANOPARTICLES WITH UNIFORM SURFACE USING EVAPORATION DYNAMICS AND SURFACE ENERGY CONTROL

(71) Applicant: KOREA ADVANCED INSTITUTE OF SCIENCE AND TECHNOLOGY, Daejeon (KR)

(72) Inventors: Yeonsik Jung, Daejeon (KR); Kyeongmin Song, Daejeon (KR); Moohyun Kim, Daejeon (KR); Tae Won Nam, Daejeon (KR); Hyunjin Cho, Daejeon (KR); Hongjoo Shin, Daejeon (KR); Geon Yeong Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 157 days.

(21) Appl. No.: 17/770,211

(22) PCT Filed: Feb. 8, 2022

(86) PCT No.: PCT/KR2022/001904
§ 371 (c)(1),
(2) Date: Apr. 19, 2022

(87) PCT Pub. No.: WO2022/177222
PCT Pub. Date: Aug. 25, 2022

(65) Prior Publication Data
US 2023/0172038 A1 Jun. 1, 2023

(30) Foreign Application Priority Data

Feb. 17, 2021 (KR) ........................ 10-2021-0020787
Feb. 7, 2022 (KR) ........................ 10-2022-0015522

(51) Int. Cl.
*H10K 50/115* (2023.01)
*B82Y 40/00* (2011.01)
(Continued)

(52) U.S. Cl.
CPC ............ *H10K 71/135* (2023.02); *B82Y 40/00* (2013.01); *H10K 50/115* (2023.02); *H10K 71/15* (2023.02);
(Continued)

(58) Field of Classification Search
CPC .. H10K 71/135; H10K 50/115; H10K 77/111; H10K 71/15; H10K 85/146; B82Y 40/00
See application file for complete search history.

(56) References Cited

U.S. PATENT DOCUMENTS 6,177,133 B1 * 1/2001 Gurer ..................... B05D 1/005
427/240
2010/0183861 A1 * 7/2010 Ogawa ..................... C09D 7/62
428/323
(Continued)

FOREIGN PATENT DOCUMENTS

JP 11337726 A * 12/1999 ....... B29D 11/00365
JP 2014-195794 10/2014
(Continued)

OTHER PUBLICATIONS

International Search Report mailed May 30, 2022 for PCT/KR2022/001904.

*Primary Examiner* — Nathan H Empie

(57) ABSTRACT

The present disclosure relates to a method of printing multi-nanoparticles using evaporation dynamics and surface energy control, the method includes: a step S1 of forming a pattern on a surface of a substrate by irradiating ultraviolet rays to a portion of the surface through a photomask; a step S2 of coating the substrate with a solution containing
(Continued)

nanoparticles; and a step S3 of lowering surface energy of the coated nanoparticles.

5 Claims, 7 Drawing Sheets

(51) Int. Cl.
  *H10K 71/13* (2023.01)
  *H10K 71/15* (2023.01)
  *H10K 77/10* (2023.01)
  *H10K 85/10* (2023.01)
  *B82Y 20/00* (2011.01)
  *H10K 102/00* (2023.01)

(52) U.S. Cl.
  CPC ......... *H10K 77/111* (2023.02); *H10K 85/146* (2023.02); *B82Y 20/00* (2013.01); *H10K 2102/351* (2023.02)

(56) References Cited

U.S. PATENT DOCUMENTS

| | | | |
|---|---|---|---|
| 2012/0015146 A1* | 1/2012 | Advincula | B05D 3/14 |
| | | | 428/419 |
| 2018/0031911 A1* | 2/2018 | Liu | G02F 1/133617 |
| 2020/0013931 A1* | 1/2020 | Hong | H01L 33/502 |
| 2021/0167133 A1* | 6/2021 | Nakata | H04N 23/63 |

FOREIGN PATENT DOCUMENTS

| | | |
|---|---|---|
| KR | 10-2013-0006837 | 1/2013 |
| KR | 10-2016-0000562 | 1/2016 |
| KR | 10-2017-0136803 | 12/2017 |
| KR | 10-1846741 | 4/2018 |
| KR | 10-2020-0127392 | 11/2020 |

* cited by examiner

EVAPORATION DYNAMICS

SEM image: smooth surface $$= \frac{Intensity\ of\ green}{(Intensity\ of\ green + Intensity\ of\ red)}$$

METHOD OF PRINTING MULTI-NANOPARTICLES WITH UNIFORM SURFACE USING EVAPORATION DYNAMICS AND SURFACE ENERGY CONTROL

This application claims the priority of Korean Patent Application No. 10-2021-0020787, filed on Feb. 17, 2021, and 10-2022-0015522, filed on Feb. 7, 2022 in the KIPO (Korean Intellectual Property Office), the disclosure of which is incorporated herein entirely by reference. Further, this application is the National Stage application of International Application No. PCT/KR2022/001904, filed on Feb. 8, 2022, which designates the United States and was published in Korean. Each of these applications is hereby incorporated by reference in their entirety into the present application.

TECHNICAL FIELD

The present disclosure relates to a method of printing multi-nanoparticles with a uniform surface using evaporation dynamics and surface energy control.

BACKGROUND ART

High-performance next-generation nano devices such as next-generation sensors, memories, and lasers have high potential due to their excellent performance and utilization. In next-generation nano devices, nanoparticles with high functionality and physical properties different from those of existing bulk materials may be key components. Accordingly, along with research on synthesizing nanoparticles, a technology for realizing nanoparticles in a solution as a specific array beyond a simple agglomerate or a composite mixed with other materials may be essential in the fabrication of next-generation nano devices.

However, nanoparticle array technologies developed so far have limitations in forming high-efficiency devices because they may not form a uniform surface or may not form an array made of various materials without damaging printed nanoparticles and a substrate under the printed nanoparticles. It is known that inkjet-based printing has a limitation in pattern formation control, and thus it is difficult to form a pattern with a uniform surface, and when a polymer transfer medium such as polydimethylsiloxane (PDMS) is used, during a transfer process, residue is left on nanoparticles and a substrate under the nanoparticles or optical and electrical damage occurs.

Because recently reported optical lithography mostly uses radical-based chemical reactions, physical and chemical damage to nanoparticles occurs, resulting in low device function.

DISCLOSURE OF THE INVENTION

Technical Problem

To solve the problems, the present disclosure provides a method of non-destructively printing multi-nanoparticles with a uniform surface by controlling evaporation dynamics and surface energy of a nanoparticle array.

The present disclosure also provides a device including a substrate printed by using the method.

Objectives of the present disclosure are not limited thereto, and other unmentioned objectives will be clearly understood by one of ordinary skill in the art to which the present disclosure pertains from the following description.

Technical Solution

To solve the problems, according to an embodiment of the present disclosure, a method of printing multi-nanoparticles includes: a step S1 of forming a pattern on a surface of a substrate by irradiating ultraviolet rays to a portion of the surface through a photomask; a step S2 of coating the substrate with a solution containing nanoparticles; and a step S3 of lowering surface energy of the coated nanoparticles.

The step S2 may include coating the solution on the portion of the surface of the substrate irradiated with the ultraviolet rays in the step S1.

The steps S1 through S3 may be repeatedly performed multiple times.

The pattern in the step S1 may have a diameter of 3 um to 100 cm, and the ultraviolet rays may be irradiated at a wavelength of 100 to 500 nm for 10 seconds to 10 minutes.

The substrate may be formed of at least one material selected from the group consisting of a metal, a metal oxide, a semiconductor, and a polymer.

The substrate may include polyvinylcarbazole (PVK).

The step S2 may include performing spin coating at 1,000 to 10,000 rpm.

The nanoparticles may be quantum dots.

The quantum dots may be at least one selected from the group consisting of GaN, GaAs, GaP, InP, InAs, ZnS, CdS, CdSe, ZnO, MgO, $SiO_2$, CdO, SiC, $B_4C$, $Si_3N$, and $In_2O_3$.

The step S3 may include applying a solution containing a ligand having surface energy of 20 mN/m or less to the nanoparticles.

The solution containing the ligand may include at least one selected from the group consisting of perfluorodecanediol, 2-(perfluoroexyl)ethanediol, perfluorooctanediol, perfluorodecanesulfonic acid, and perfluorooctanesulfonic acid.

According to another embodiment of the present disclosure, a nanoparticle pattern formed by the method of non-destructively printing multi-nanoparticles with a uniform surface includes: a nanoparticle thin film; and a material layer formed at an edge of the nanoparticle thin film, wherein the material layer has a thickness greater than a thickness of the nanoparticle thin film.

The thickness of the material layer may be determined according to a nanoparticle concentration of the solution.

The present disclosure also provides a substrate printed by using the method.

The present disclosure also provides a device including the substrate.

Advantageous Effects

Because a method of printing nanoparticles with a uniform surface of the present disclosure uses simple evaporation acceleration without adding an organic material or internal liquid flow, the method may be applied without restrictions on a size and a constituent material of nanoparticles. Also, because a chemically programmed substrate may use various methods such as masked UV-ozone, various types of particle arrays may be formed.

Because a method of printing multi-nanoparticles of the present disclosure may fabricate solution-based nanoparticles as a film with a uniform surface by controlling an evaporation function, the method may be applied to various stacked solution process-based devices. Also, evaporation dynamics control may be applied to other solution processing technologies such as inkjet printing to fabricate uniform surface patterns for general purposes.

Because a process of fabricating a multi-nanoparticle array of the present disclosure does not require both a polymer transfer medium used in transfer printing and a radical used in optical patterning, optical and electrical damage to used particles and a target substrate does not occur, and thus, the process may be applied to, for example, a quantum dot light-emitting diode (QLED) using an organic material thin film as a device component.

A technology provided by the present disclosure is a technology for configuring a low-cost, large-area nanoparticle array and non-destructively printing the nanoparticle array on various substrates. When the technology is applied to fabricate next-generation electronic equipment that may use a printing process as an advantage, economic effects may be achieved by improving the performance of the equipment or minimizing the fabrication cost.

BEST MODE FOR CARRYING OUT THE INVENTION

The present disclosure provides a technology capable of non-destructively printing various nanoparticles with a uniform surface, by accelerating evaporation of a solvent during nanoparticle printing to form an array with a uniform surface, and then lowering surface energy of a patterned nanoparticle array to prevent contamination due to repeated wetting of the patterned nanoparticle array during another nanoparticle printing.

The present disclosure provides a method of printing multi-nanoparticles, the method including a step S1 of forming a pattern on a surface of a substrate by irradiating ultraviolet (UV) rays to a portion of the surface through a photomask; a step S2 of coating the substrate with a solution containing nanoparticles; and a step S3 of lowering surface energy of the coated nanoparticles.

Figure 1:
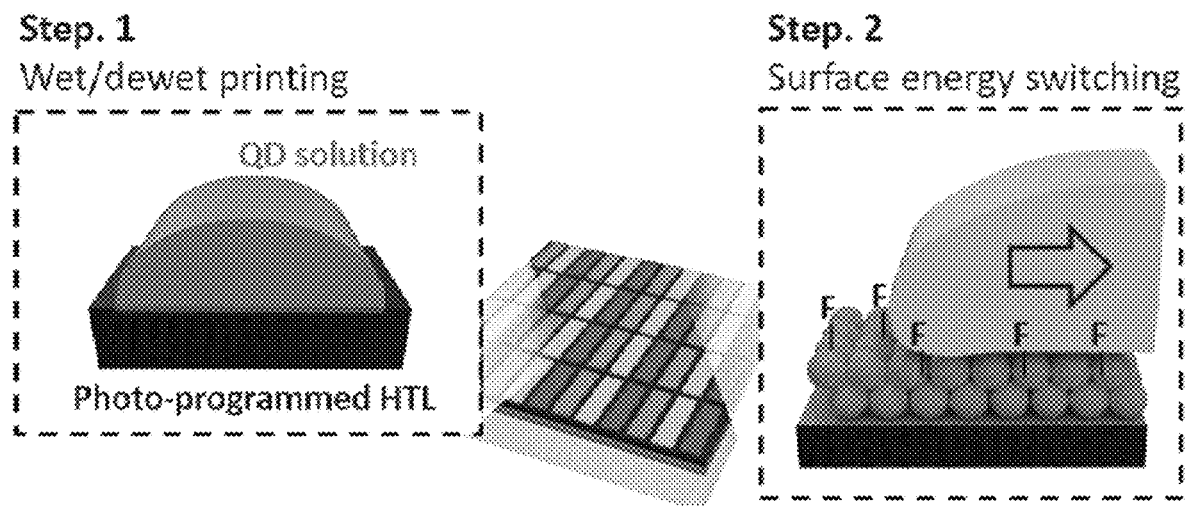
FIG. 1 is a diagram illustrating a nanoparticle array fabrication principle used in the present disclosure.
Figure 2:
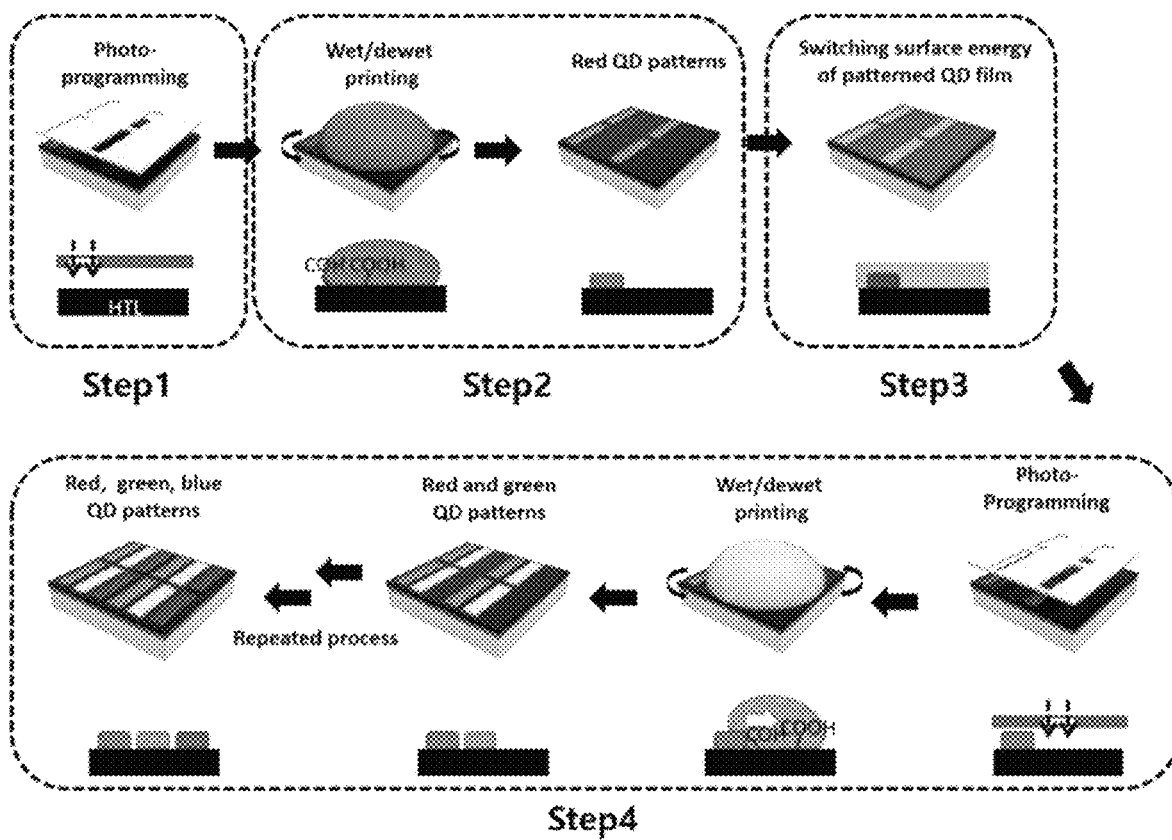
FIG. 2 is a diagram illustrating each nanoparticle array fabrication process used in the present disclosure.

FIG. 1 is a diagram illustrating a method of printing multi-nanoparticles according to an embodiment of the present disclosure. FIG. 2 is a diagram illustrating the method of printing nanoparticles of the present disclosure for each process. Each step will now be described with reference to FIG. 2.

In a step S1 of the present disclosure that is a step of forming a pattern by irradiating ultraviolet (UV) rays, UV rays are irradiated to a portion of a surface of a substrate through a photomask in order to program a target substrate. Surface energy of the portion to which the UV rays are irradiated may be increased, and thus, selective wetting may occur only in the portion exposed to the UV rays during nanoparticle contact, thereby making it possible to form a pattern.

However, when the UV irradiation is excessive, destruction of the target substrate occurs, and when the UV irradiation is too insufficient, the surface energy of the substrate is not sufficiently increased, and thus wetting of a nanoparticle solution does not occur. Accordingly, UV rays are irradiated with an intensity at which nanoparticles may be patterned by using selective wetting while preserving the properties of the target substrate.

The substrate may be formed of a metal, a metal oxide, a semiconductor, or a polymer material, and particularly, the substrate may be a flexible substrate including a plastic substrate, a glass substrate, a silicon wafer, a ceramic substrate, or a metal substrate. In an embodiment of the present disclosure, when UV irradiation was performed by using polyvinylcarbazole (PVK) as a substrate, it was found that when UV rays were irradiated for 10 minutes, there was damage to electrical properties such as conductivity of PVK; and when UV rays were irradiated for 5 seconds, there was no significant change in electrical properties such as conductivity of PVK but selective wetting of a nanoparticle solution did not occur. Accordingly, optimization was performed and it was found that it is preferable to perform for 40 seconds at a wavelength of 184 nm to 253 nm. A used nanoparticle solution was a solution containing quantum dots (QD) at a concentration of 25 mg/mg (in QD ink), and spin coating rpm was 3000 rpm.

Figure 3:
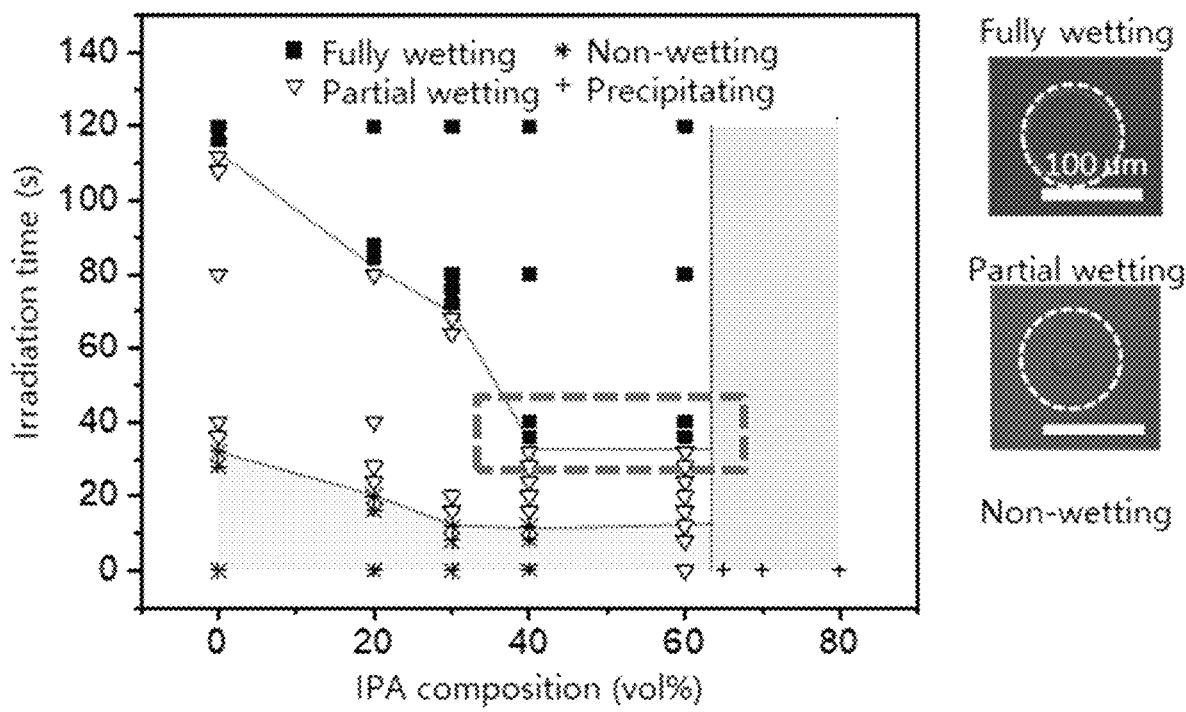
FIG. 3 illustrates a result showing a change in an ultraviolet (UV) exposure time according to a concentration of isopropyl alcohol (IPA).

The quantum dots may be at least one selected from the group consisting of, but not limited to, GaN, GaAs, GaP, InP, InAs, ZnS, CdS, CdSe, ZnO, MgO, $SiO_2$, CdO, SiC, $B_4C$, $Si_3N$, and $In_2O_3$. The solution containing the quantum dots may contain isopropyl alcohol (IPA) having low surface tension as a solvent, and when the IPA is included, QD ink may be selectively wetted on an organic hole transport layer with only with shortest UV exposure. As shown in FIG. 3, it is found that a UV irradiation time decreases as a concentration of IPA increases. When IPA was added to QD ink, a UV time required for QD patterning was reduced, and could be reduced to 40 s. That is, it was found that QD patterning was possible with a shorter UV time when IPA was added to QD ink. 20 vol % or more, preferably 30 to 60 vol %, of IPA may be included. In addition to the IPA, water may be included.

Figure 4:
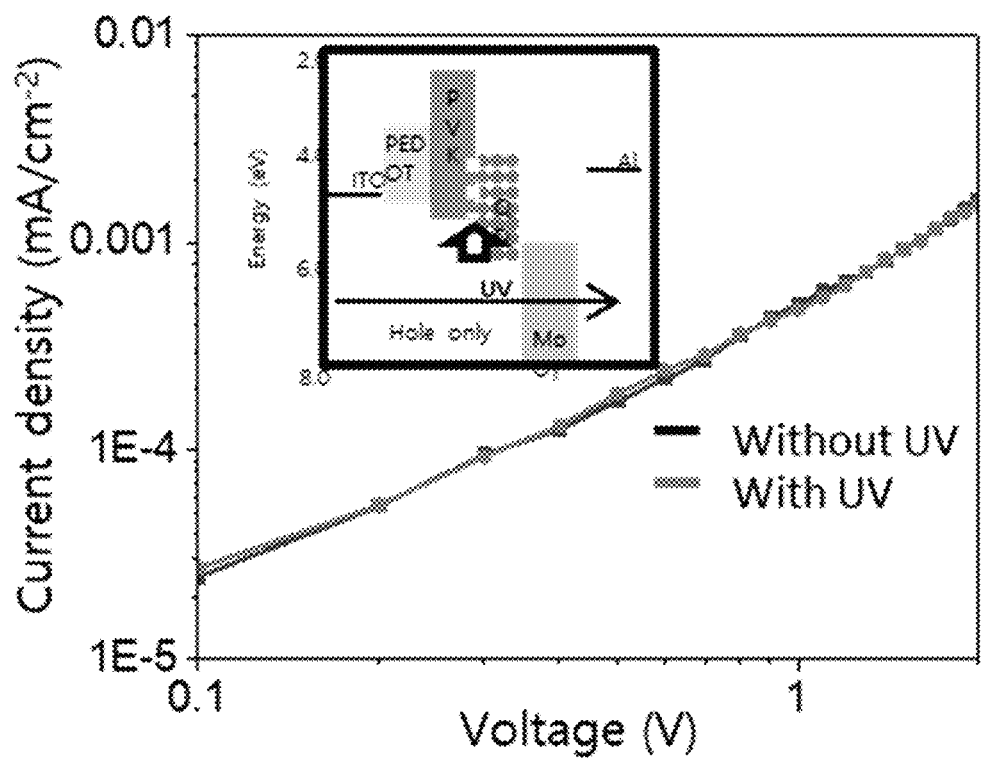
FIG. 4 illustrates a result showing whether there is electrical damage after pattern formation of the present disclosure.

As such, although UV rays may be irradiated with an intensity of 100 to 500 nm for 10 seconds to 10 minutes, a time of destruction due to the UV rays may vary according to a used substrate. Also, because a solvent of a used nanoparticle solution in addition to the substrate may be different, when a material different from conditions described in the present disclosure is used, a UV irradiation time, a concentration of nanoparticles, and spin coating rpm may be specified differently. According to nanoparticle solution and substrate conditions of the present disclosure, a UV irradiation time may be shortened. As shown in an IV curve result of FIG. 4, it is found that short UV exposure does not cause great electrical damage to an organic transport layer.

Figure 5:
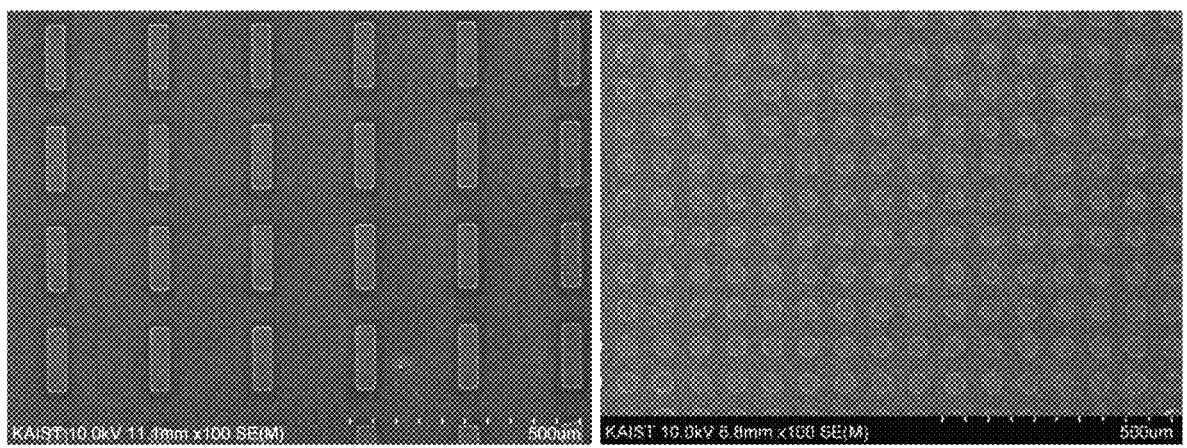
FIG. 5 illustrates a scanning electron microscopy (SEM) image after pattern formation of the present disclosure.

Also, the pattern may be a circular pattern having a diameter of 3 um to 100 cm. However, in addition to the circular pattern, as shown in FIG. 5, various patterns may be formed according to a shape of a mask, and a target substrate programming method such as photolithography in addition to UV irradiation used in the present disclosure may be applied.

Figure 6:
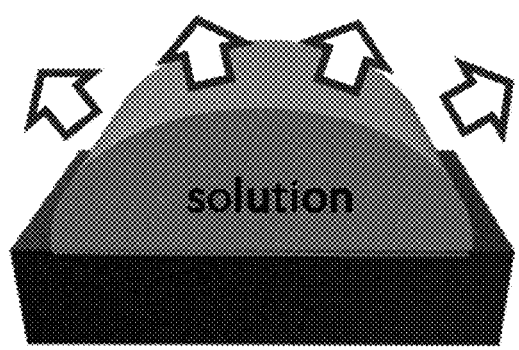
FIG. 6 is a diagram illustrating a nanoparticle array with a uniform surface formed by adjusting an evaporation rate used in the present disclosure.

In the step S2 that is a step of coating a solution containing nanoparticles on the substrate on which the pattern is formed by irradiating the ultraviolet rays, in order to form a nanoparticle array with a uniform surface on the substrate programmed through the photomask, evaporation acceleration was applied to a selective wetting process by adjusting spin coating rpm. A principle is as shown in FIG. 6. When a speed of spin coating increases, a solvent evaporation rate increases. In this case, when the solvent evaporation rate is higher than a moving speed of particles in a solution, the internal particles are trapped on a surface of the solution and aligned to be uniform due to thermodynamics. This process continues until all of the solvent of the solution evaporates, and finally a pattern with a uniform surface is formed.

Figure 7:
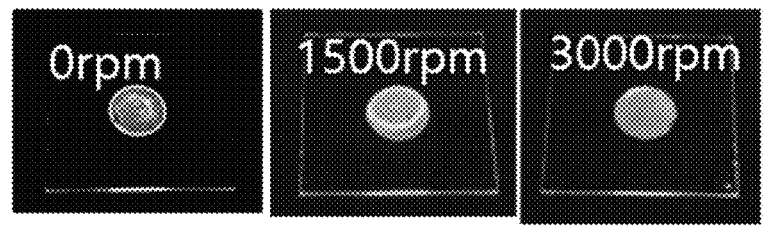
FIG. 7 illustrates an evaporation rate according to rpm and a degree of film formation.
Figure 7:
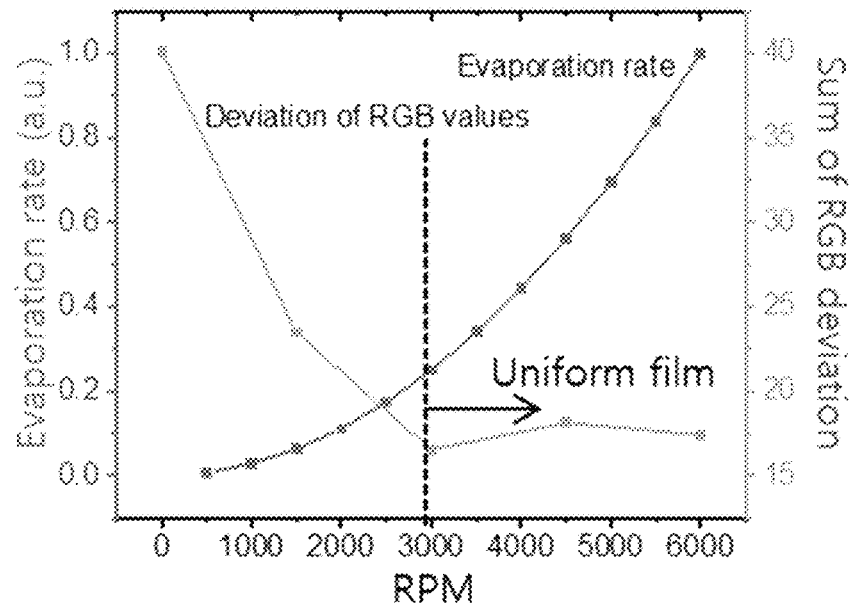

FIG. 7 illustrates a result showing an evaporation rate according to rpm and a degree of film formation. As an RGB deviation value decreases, it means that a shape of a pattern is more uniform. An evaporation rate increased at high rpm and a uniform QD pattern was obtained.

Figure 8:
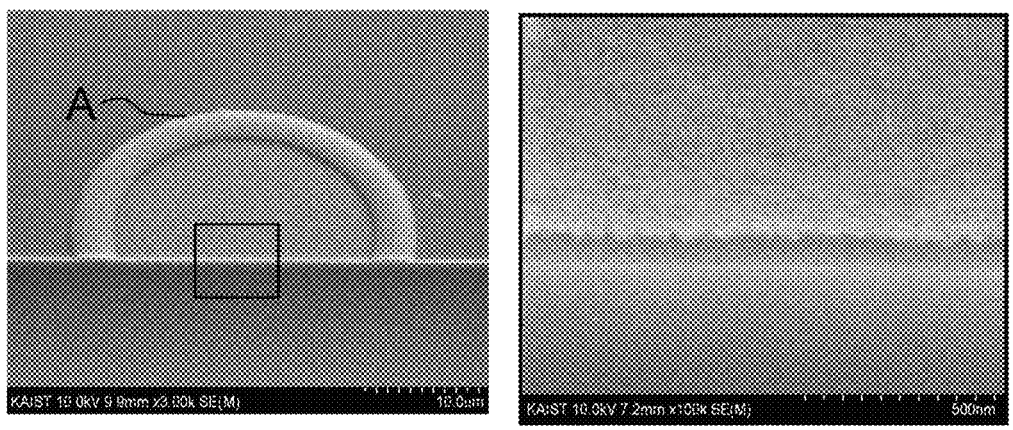
FIG. 8 illustrates an SEM image, an atomic force microscopy (AFM) analysis, and a transmission electron microscopy (TEM) image of a substrate on which a quantum dot pattern is formed.

A tilt scanning electron microscopy (SEM) analysis result (plan view) is illustrated in FIG. 8.

Referring to FIG. 8, in a pattern formed according to the present disclosure, a thin film with a uniform surface is formed therein and a material layer containing particles may be formed as a separate layer with a large thickness at an edge of the uniform thin film (see A of FIG. 8).

That is, according to the present disclosure, a thin film with a uniform surface is fabricated by increasing an evaporation rate and inducing particles to be trapped in a solvent. However, in this case, no matter how fast the evaporation rate is, all of the particles of the solvent are not initially trapped on a surface of a water droplet. Accordingly, the particles that are not trapped move to both ends of the water droplet, and thus, a layer with a greater thickness is formed at an edge of a thin film pattern with a uniform thickness.

Accordingly, a pattern according to the present disclosure includes a uniform thin film pattern formed on a substrate according to solvent evaporation and including nanoparticles, and a nanoparticle material layer formed outside the uniform thin film pattern and having a thickness greater than that of the thin film pattern due to nanoparticles that are not trapped. Also, a width and a thickness of the material layer varies from 10 nm to 1000 um according to a particle concentration and a pattern size.

Figure 9:
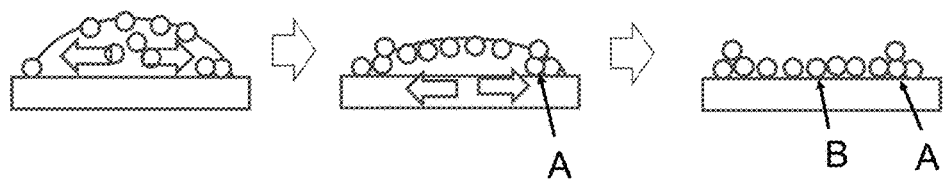
FIG. 9 is a diagram for describing a rim forming process according to the present disclosure.

FIG. 9 is a diagram for describing a rim forming process according to the present disclosure.

Referring to FIG. 9, as described above, according to the present disclosure, a thin film with a uniform surface is fabricated by increasing an evaporation rate and inducing particles to be trapped in a solvent. In this case, particles outside a droplet close to a substrate have a slower moving speed than the increased evaporation rate, and thus, are not trapped on a surface of the droplet. Accordingly, after final evaporation, in FIG. 9, an outer edge of a pattern has a thickness greater than that of a uniform inner thin film pattern B to form a rim A of a nanoparticle material layer.

Figure 10:
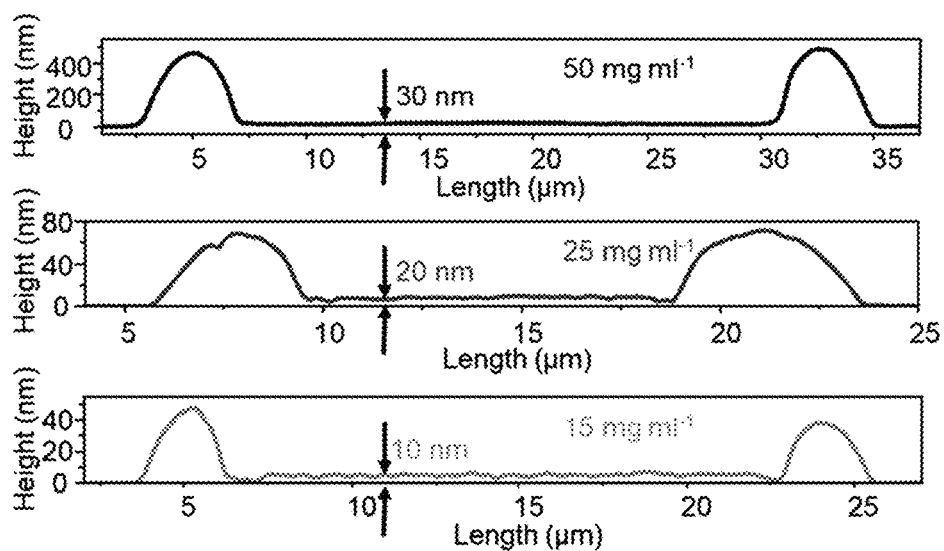
FIG. 10 illustrates an AFM analysis result of a thickness of a ring thin film according to an embodiment of the present disclosure.

FIG. 10 is a diagram illustrating an atomic force microscopy (AFM) analysis result of a width of a material layer including a rim according to an embodiment of the present disclosure.

Referring to FIG. 10, it is found that a width and a thickness of a material layer vary according to a particle concentration, and it is found that as a particle concentration increases, a particle material layer having a larger thickness is formed at an edge. That is, it is found that according to a graph showing thicknesses of both material layers of FIG. 9, a ring having a thickness of about 400 nm is formed at a concentration of 50 mg/mL, a material layer having a thickness of 70 nm is formed at a concentration of 25 mg/mL, and a material layer having a thickness of 40 nm is formed at a concentration of 15 mg/mL. Accordingly, according to the present disclosure, a thickness and a width of a material layer formed during initial evaporation may be controlled by using a solution concentration, etc., and the thickness (or cross-sectional width of the thin film itself) may range from about 10 nm to about 1000 um.

In an embodiment of the present disclosure, in the coating process, as shown in FIG. 7, when a spin coating speed is very low to about 500 rpm, an evaporation rate is not sufficiently high and thus most of nanoparticles are accumulated only at an edge of a pattern. When a spin coating speed (rpm) is increased to increase a solvent evaporation rate, a film begins to be formed and when the speed reaches specific rpm, a nanoparticle pattern with a uniform surface may be fabricated. Accordingly, the spin coating in the step S2 may be performed at, but not limited to, 1000 to 10,000 rpm.

For example, as in the present disclosure, when a green quantum dot solution of 25 mg/mL is used by using a PVK substrate, the spin coating was performed at 3000 rpm. However, because a solvent evaporation rate varies according to a target substrate and a used nanoparticle solution, when a material different from conditions described in the present disclosure is used, spin coating rpm may be specified differently.

In the step S3 that is a step of lowering surface energy of the nanoparticles, in order to variously and continuously print the nanoparticles with the uniform surface fabricated by using the above-described process, surface energy of a printed nanoparticle array was controlled. The steps S1 through S3 of the present disclosure were repeatedly performed multiple times to print multi-nanoparticles. Preferably, the steps S1 through S3 may be repeatedly performed 1 to 20 times.

Figure 11:
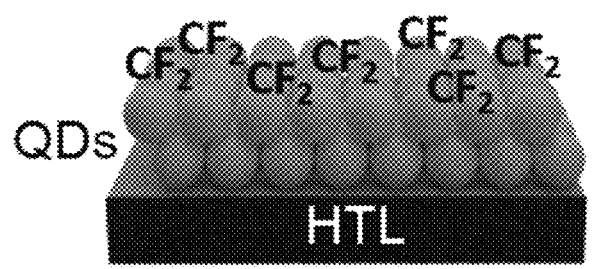
FIG. 11 illustrates a principle of a fluorocarbon treatment process of the present disclosure.

When multi-nanoparticles are printed by using selective wetting without controlling surface energy unlike in the present disclosure, repeated wetting may occur even in the printed nanoparticles below, which may cause contamination. Accordingly, the present inventors tried to solve the problem by lowering surface energy of the nanoparticles. This principle is shown in FIG. 11.

In the present disclosure, when using the substrate and the nanoparticle solution, in order to control surface energy of the nanoparticle array, perfluorodecanethiol was used as fluorocarbon having low surface energy. The perfluorodecanethiol was dissolved in perfluorodecalin and dropped onto the nanoparticle array on the target substrate, and then washed with the perfluorodecalin. In this process, the perfluorodecanethiol was exchanged with existing ligands of the printed nanoparticles due to thermodynamics.

Figure 12:
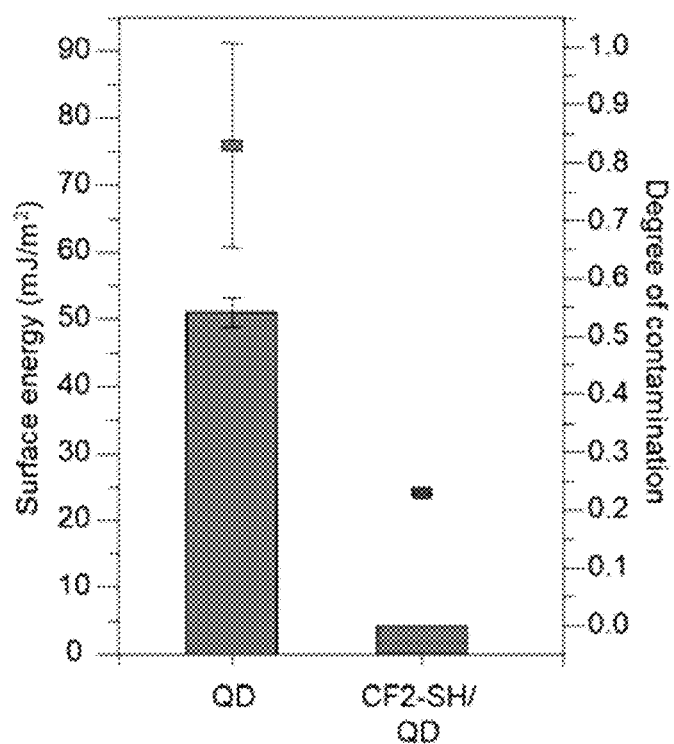
FIG. 12 illustrates a change in surface tension due to fluorocarbon treatment.
Figure 13:
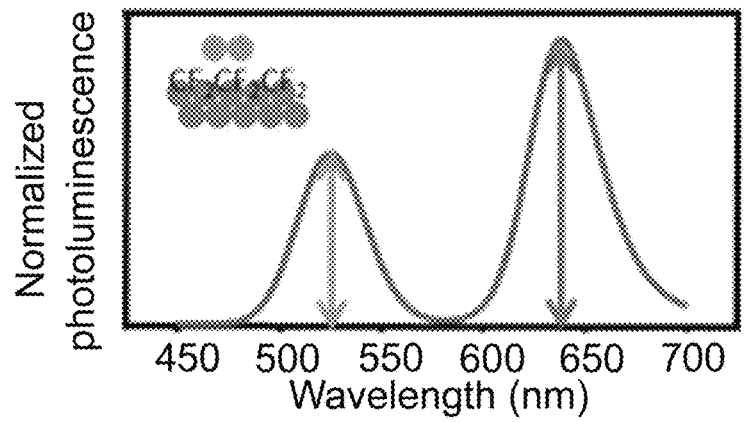
FIG. 13 illustrates a degree of contamination due to fluorocarbon treatment.
Figure 14:
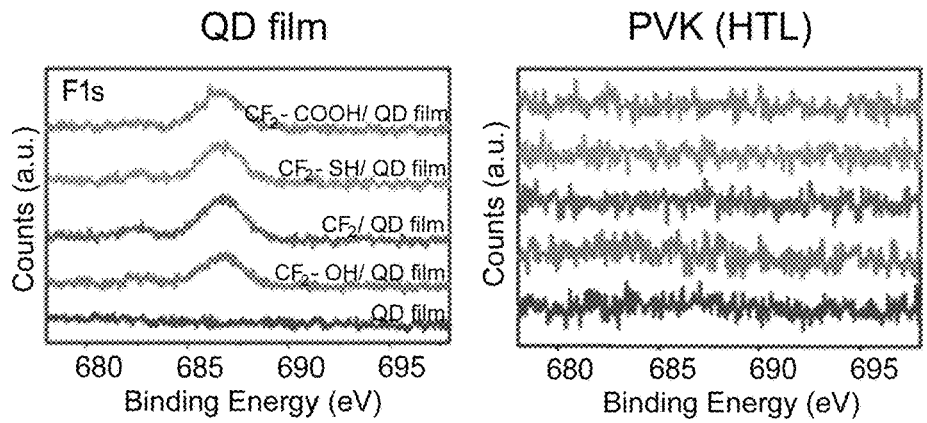
FIG. 14 illustrates an X-ray photoelectron spectroscopy (XPS) analysis result of a quantum dot (QD) film fabricated by using a method of the present disclosure.

It was found through a contact angle that surface energy of the nanoparticle array with the ligand exchange was reduced from 70 mN/m to 25 mN/m due to the perfluorodecanethiol (FIG. 12), and it was found that when another nanoparticle solution was subsequently printed, repeated wetting did not occur in the patterned nanoparticle array (FIG. 13). FIG. 14 illustrates an X-ray photoelectron spectroscopy (XPS) analysis result of a PVK substrate and a QD film fabricated by using a method of the present disclosure. It is found from the result that a process of attaching fluorocarbon thiol through ligand exchange was selective only to the QD film without affecting an underlying hole transport layer.

Figure 15:
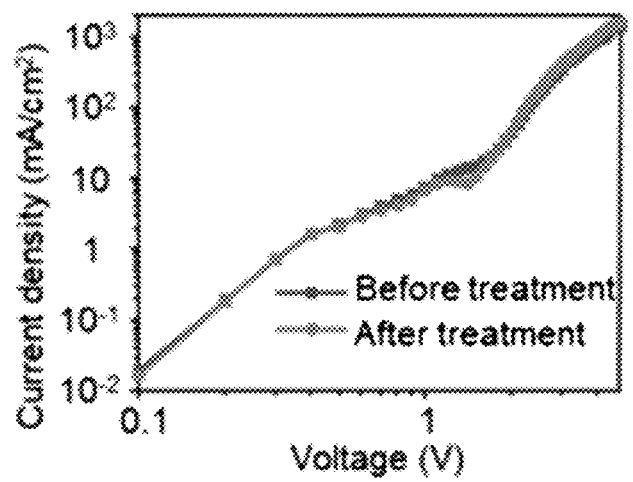
FIG. 15 illustrates a result obtained by manufacturing an electron-only device including a QD film fabricated by using a fabrication method of the present disclosure and then comparing an IV curve thereof.

Referring to FIG. 15, it was found by manufacturing an electron-only device and comparing an IV curve that fluorocarbon thiol treatment did not greatly affect charge transport of a QD film, and it is found that fluorine treatment did not interfere with the charge transport of the QD film.

Figure 16:
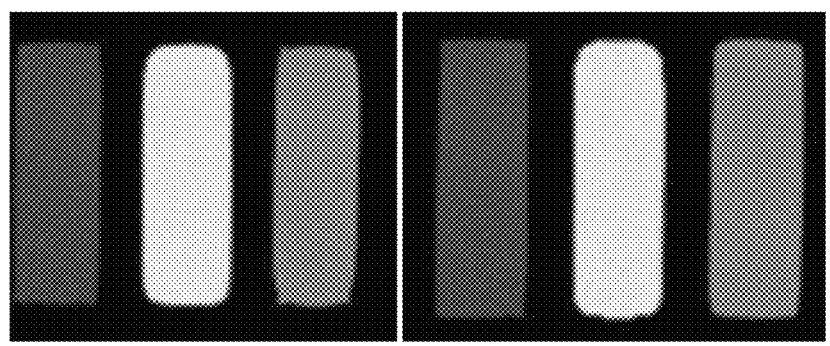
FIG. 16 illustrates a confocal image of an RGB array of the present disclosure.
Figure 17:
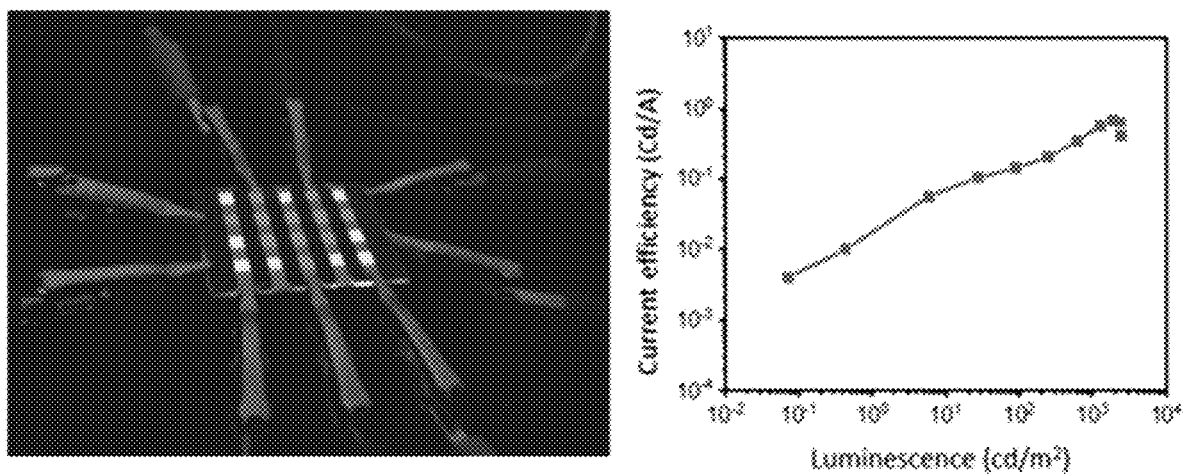
FIG. 17 illustrates a QD-light-emitting diode (LED) manufactured by using a method of the present disclosure, a light-emitting image, and a result showing LED performance.

As result, multi-colored QD patterning may be continuously performed through fluorocarbon thiol treatment, and an QD RGB array may be formed on a hole transport layer as shown in a confocal image (FIG. 16).

A substrate fabricated by using a printing method of the present disclosure may be fabricated as a patterned QD-LED as shown in FIG. 16. Also, as shown in FIG. 16, it is found that electrical performance was also excellent and actual LED performance was exhibited.

The substrate of the present disclosure may be used as a device. The device is particularly an optical device, and may include, but is not limited to, a sensor, a resistive memory, a phase change memory, a heating electrode, a sensing electrode, or a catalyst.

As the present disclosure allows for various changes and numerous embodiments, exemplary embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of the related art are omitted when it is deemed that they may unnecessarily obscure the essence of the present disclosure.

Exemplary Embodiment

As the present disclosure allows for various changes and numerous embodiments, exemplary embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of the related art are omitted when it is deemed that they may unnecessarily obscure the essence of the present disclosure.

Step 1. Irradiation of UV Rays Through Photomask to Organic Hole Transport Layer In Step 1, UV was treated through a photomask on a portion where QDs are to be patterned on a surface of an organic hole transport layer. As experimental conditions, a UV wavelength ranging from 184 nm to 253 nm, a UV irradiation time was 40 seconds, a QD concentration in QD ink was QD 25 mg/mg, a solvent composition in the QD ink was water:IPA=60:40, and the organic hole transport layer was HTL:PVK.

When UV rays were irradiated under the above conditions, surface energy of a portion exposed to the UV rays was lowered and then the QD ink was wetted only in a portion exposed to the UV rays in Step 2 to form a pattern.

In existing technology, when UV rays are irradiated until QD ink is wetted, destruction of an organic hole transport layer occurs. However, in the present embodiment, by adding a liquid (IPA) having low surface tension to QD ink, the QD ink was wetted only with short UV irradiation, thereby preventing destruction of a hole transport layer.

Step 2. Patterning Through Selective Wetting of OD Ink on UV-Treated Hole Transport Layer In Step 2, QD ink was dropped to the organic hole transport layer irradiated with the UV rays and was spin coated. A spin coating speed was 3000 rpm. As a result, it was found that the QD ink was wetted only in a portion irradiated with the UV rays, to form a pattern.

While a QD pattern formed by using existing selective wetting technology does not satisfy conditions required to use a light-emitting layer, in the present embodiment, a QD pattern satisfying light-emitting layer conditions is formed by inducing fast solvent evaporation of a QD ink droplet wetted in a portion irradiated with UV rays by adjusting spin coating.

Step 3. Fabrication of RGB Array Through Fluorocarbon Treatment

In Step 3, fluorocarbon was dropped to the QD-patterned organic hole transport layer, and then was immediately washed. Perfluorodecanethiol was used as the fluorocarbon, and a solvent for washing was hexane. The fluorocarbon was attached to the patterned QD surface, thereby lowering surface energy of the QD pattern.

In existing selective wetting technology, when another color QD is continuously printed, the other color QD is contaminated on a previously patterned QD surface. However, in the present embodiment, through a new approach, that is, fluorocarbon attachment, contamination of another color QD on a patterned QD surface was prevented.

Step 4. Repetition of the Above Process

In Step 4, Step 1 through Step 3 were repeatedly performed. As a result, an RGB QD array was formed on the organic HTL.

While present disclosure has been particularly shown and described with reference to embodiments thereof, it will be understood by one of ordinary skill in the art that the embodiments are merely preferred embodiments and should not be construed as limiting the concept or scope of present disclosure. Accordingly, the scope of the present disclosure is defined by the attached claims and their equivalents.

The invention claimed is:

1. A method of printing multi-nanoparticles, the method comprising:
    a step S1 of forming a pattern on a surface of a substrate by irradiating ultraviolet rays to a portion of the surface through a photomask;
    a step S2 of coating the substrate with a solution containing nanoparticles; and
    a step S3 of lowering surface energy of the coated nanoparticles,
    wherein the step S2 comprises coating the solution on the portion of the surface of the substrate irradiated with the ultraviolet rays in the step S1 at a wavelength of 100 to 500 nm for 10 seconds to 10 minutes,
    wherein the step S2 comprises performing spin coating at 1,000 to 10,000 rpm,
    wherein the coated nanoparticles are quantum dots, and the step S3 comprises applying a solution containing a perfluorodecanethiol to make perfluorodecanethiol attach to the quantum dots via ligand exchange between the quantum dots and perfluorodecanethiol, thereby lowering surface energy, and
    wherein the steps S1 through S3 are repeatedly performed multiple times.

2. The method of printing multi-nanoparticles of claim 1, wherein the substrate is formed of at least one material selected from the group consisting of a metal, a metal oxide, a semiconductor, and a polymer.

3. The method of printing multi-nanoparticles of claim 2, wherein the substrate comprises polyvinylcarbazole (PVK).

4. The method of printing multi-nanoparticles of claim 1, wherein the quantum dots are at least one selected from the group consisting of GaN, GaAs, GaP, InP, InAs, ZnS, CdS, CdSe, Zno, MgO, $SiO_2$, CdO, SiC, $B_4C$, $Si_3N$, and $In_2O_3$.

5. The method of printing multi-nanoparticles of claim 1, wherein the substrate is a flexible substrate selected from the group consisting of a plastic substrate, a glass substrate, a silicon wafer, a ceramic substrate, and a metal substrate.

* * * * *